(12) United States Patent
Czech et al.

(10) Patent No.: US 8,344,784 B2
(45) Date of Patent: Jan. 1, 2013

(54) METHOD AND CIRCUIT ARRANGEMENT FOR CONTROLLING SWITCHING TRANSISTORS OF AN INTEGRATED CIRCUIT

(75) Inventors: Martin Czech, Munich (DE); Ulrich Theus, Gundelfingen (DE)

(73) Assignee: Micronas GmbH, Freiburg I. Br. (DE)

( * ) Notice: Subject to any disclaimer, the term of this patent is extended or adjusted under 35 U.S.C. 154(b) by 56 days.

(21) Appl. No.: 12/960,806

(22) Filed: Dec. 6, 2010

(65) Prior Publication Data

US 2011/0133782 A1 Jun. 9, 2011

(30) Foreign Application Priority Data

Dec. 4, 2009 (DE) .......................... 10 2009 057 107

(51) Int. Cl.
*H03L 5/00* (2006.01)

(52) U.S. Cl. ..................................... 327/308; 333/81 R
(58) Field of Classification Search .................... 327/54, 327/427, 587–588, 108, 306, 308; 333/81 R
See application file for complete search history.

(56) References Cited

U.S. PATENT DOCUMENTS

| | | | | |
|---|---|---|---|---|
| 5,163,325 A | * | 11/1992 | White et al. ............... | 73/514.24 |
| 7,010,971 B2 | * | 3/2006 | Matsumoto et al. ....... | 73/204.15 |
| 7,658,102 B2 | * | 2/2010 | Ohtsuka et al. ........... | 73/204.15 |

FOREIGN PATENT DOCUMENTS

| | | |
|---|---|---|
| EP | 0 520 685 B1 | 1/1997 |
| EP | 1 639 708 B1 | 4/2008 |
| JP | 407306090 | * 11/1995 |
| JP | 409005413 | * 1/1997 |

* cited by examiner

*Primary Examiner* — Dinh T. Le
(74) *Attorney, Agent, or Firm* — Muncy, Geissler, Olds & Lowe, PLLC

(57) ABSTRACT

A method and circuit arrangement is provided for controlling switching transistors of an integrated circuit, with a bridge circuit and with a control unit, which is designed and/or has a program so that the control unit is designed as a measuring device and measures a bridge voltage of the bridge circuit, outputs an adjusting signal for adjusting a component of a bridge circuit, and outputs a control signal for activating the switching transistors. When the bridge circuit) has a branch with a resistor network and a transistor connected in series, and the control unit is designed and/or has a program so that the adjusting signal for adjusting a resistance value of the resistor network is switchable as the component dependent on the bridge voltage.

17 Claims, 7 Drawing Sheets

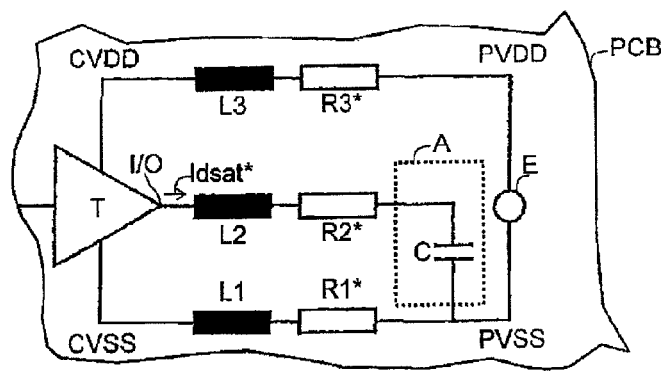
Fig. 16 (State of the art)
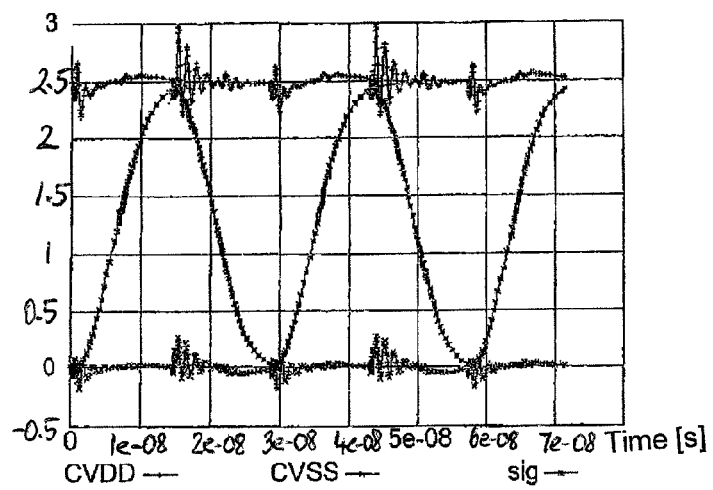
Fig. 17 (State of the art)
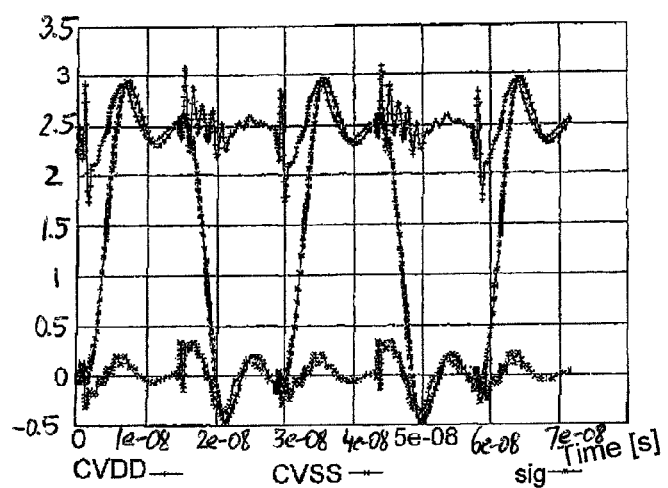
Fig. 18 (State of the art)

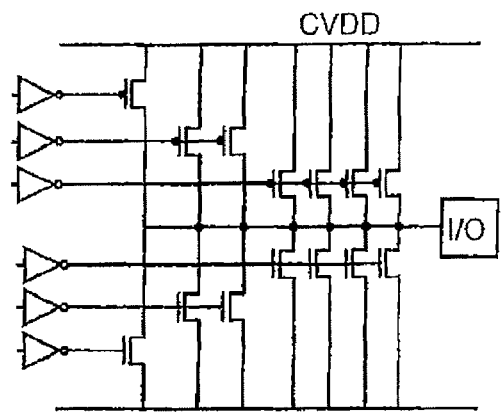
Fig. 19 (State of the art)
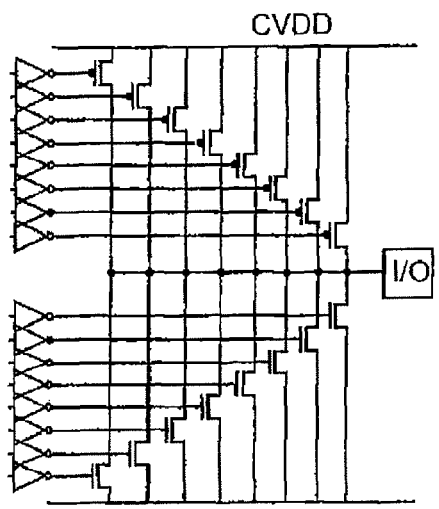
Fig. 20 (State of the art)
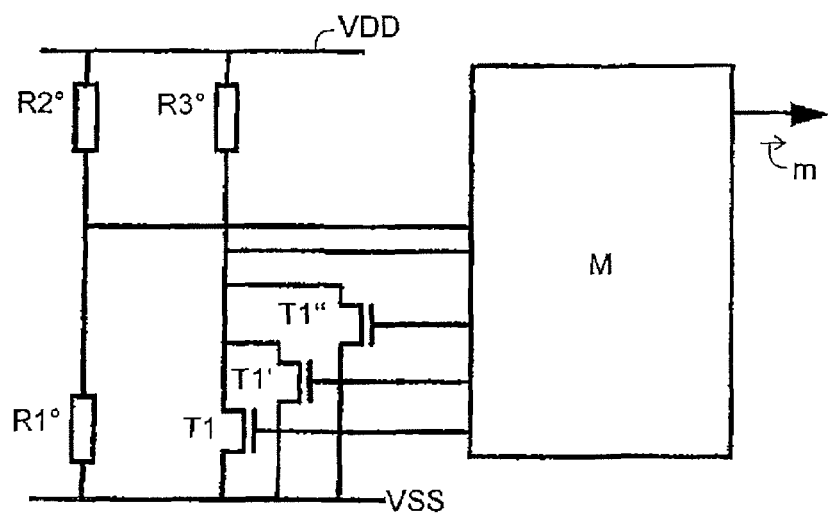
Fig. 21 (State of the art)

METHOD AND CIRCUIT ARRANGEMENT FOR CONTROLLING SWITCHING TRANSISTORS OF AN INTEGRATED CIRCUIT

This nonprovisional application claims priority under 35 U.S.C. §119(a) to German Patent Application No. DE 102009057107.8, which was filed in Germany on Dec. 4, 2009, and which is herein incorporated by reference.

BACKGROUND OF THE INVENTION

1. Field of the Invention

The invention relates to a circuit arrangement for controlling switching transistors of an integrated circuit and to a method for controlling switching transistors of an integrated circuit.

2. Description of the Background Art

Switching applications of switching transistors are known, for example, transistors in switching voltage regulators, in which for example just a channel resistance must be minimized simply to avoid losses. In this case, transistor sizing is used, as provided by the available area. External circuit components, e.g., coils, are used for curve shaping of a current to avoid, e.g., EMC problems (EMC: electromagnetic compatibility).

Losses in switching applications for data transmission are less interesting. This applies, e.g., in input/output circuits located in the transition region from a chip to a printed circuit board. The curve shaping in this case is also determined by the switching transistor and not solely by external components. In this regard, it is a matter of an absolute value of transistor parameters. However, parameters of switching transistors in CMOS technology vary in their properties, e.g., in the form of temperature, operating voltage, and technology variations in the range of a factor of 2 . . . 2.5. If actual parameters or an actual parameter position of the switching transistors is known, countermeasures could be taken, e.g., by varying a number of active transistors.

FIG. 16 shows an exemplary input/output circuit according to the state of the art. Circuit components that represent in part only parasitic effects of lines are shown on an electronic printed circuit board (PCB). A driver circuit T is used to drive a complex, particularly capacitive load A, which by way of example has a capacitor C as a capacitive component. In CMOS technology, this is arranged as a chip on the PCB. An input/output I/O of driver circuit T is applied at an input of the load A. Parasitic effects due to the line between these components are shown by an inductive component L2 and an ohmic resistor R2*. An operating voltage source E supplies an operating voltage PVDD-PVSS, which provides a positive PCB supply voltage PVDD compared with a base supply voltage PVSS, whereby the base supply voltage PVSS depending on the circuit can also be a negative printed PCB voltage. The load A is also applied at the PCB base supply voltage PVSS. In addition, a line from the PCB base supply voltage leads to a voltage terminal of driver circuit T. A base chip supply voltage CVSS is present at the chip of the driver circuit T, however, due to parasitic effects of the line, which by way of example are represented by an inductive component L1 and an ohmic resistor R1*. The base chip supply voltage CVSS or a corresponding negative chip supply voltage CVSS is the same on average compared with the base supply voltage PVSS, but with alternating voltage components. By means of another line, another voltage terminal of the driver circuit T is applied to the positive PCB supply voltage PVDD. A modified positive chip supply voltage CVDD is present at the driver circuit T due to parasitic effects, which are shown as an inductive component L3 and an ohmic resistor R3*.

Thus, a CMOS driver circuit T on the integrated circuit controls an external load as the exemplary capacitive load A with the capacitive component C. A housing of the integrated driver circuit T and the traces on the PCB have parasitic elements in the form of the inductive components L1-L3 and ohmic resistors R1*-R3*, as well as various coupling capacitors, which are not shown in the simplified circuit diagram.

At the start of a switching process of the driver circuit T, final stage transistors as switching transistors in an inverter circuit in the driver circuit T rapidly reach their full gate voltage, whereby a drain-source voltage of the final stage transistors corresponds to an operating voltage PVDD-PVSS of the operating voltage source E. The driver circuit T thereby supplies a current Idsat* as an output current of a driver stage. Said output current Idsat* substantially determines a time period required for recharging of the capacitance of the capacitive component C in the capacitive load A. In this regard, a current path through the final stage transistors causes interference voltages as well, however, which occur at the inductive elements or components L1-L3, and thereby also causes the excitation of forming so-called RLC resonant circuits. These are in particular the resonant circuits, which form from the input/output I/O via the second inductive component L2, the second ohmic resistor R2*, the capacitive component C, and then, on the one hand, the operating voltage source E, the third ohmic resistor R3*, and the third inductive component L3 to the positive voltage terminal of the driver circuit T and, on the other, from the capacitive component C via the first resistor R1* and the first inductive component L1 to the negative or base voltage terminal of the driver circuit T. This is also influenced by the output current Idsat*, when a speed of gate control also plays a role. After about ⅘ of the recharging, the final stage transistors, however, no longer work as the current source, but resistively, which as a parameter corresponds to a channel resistance Ron of the transistor in the triode region. It is responsible for damping of the resonant circuits, because the shown parasitic resistors R1*-R3* have very low values, which do not lead to a notable additional damping. The output current Idsat* and the channel resistance are linked together via a width/length ratio of the affected final stage transistors.

FIG. 17 shows the relationships at a moderate output current Idsat* or high channel resistance by way of example as a voltage-time diagram. Shown are a positive chip supply voltage CVDD and a base chip supply voltage CVSS, which are measured in the driver circuit, whereby the external base chip supply voltage PVSS is used as a reference point. The oscillations arising thereby are considerably dampened. A signal sig at the load A is only slightly distorted.

FIG. 18 shows a corresponding voltage-time diagram at a higher output current Idsat*, at which the disturbances are worse compared with FIG. 17. It is evident that even a slight oversizing of the driver leads to less dampened oscillations of the chip internal supply voltage CVDD or CVSS, so that the output signal no longer lacks oscillations. The peaks on the positive internal supply voltage CVDD become larger. A greater driver circuit T can Make the overall situation worse. The behavior can be much worse with still greater wrong sizing of the driver circuit T. Voltage dips in the internal positive supply voltage CVDD down to half and an up to 1.5-fold overshooting are not extreme cases.

The use of measuring circuits for measuring the parameters, e.g., according to FIG. 21, has also been tried. A control unit M varies a number of active transistors T1, T1', T1", etc., by means of a control signal until a bridge circuit is balanced. The bridge circuit is formed by two resistors R1°, R2°, connected in series between the base supply voltage VSS and the positive supply voltage VDD, with a node located between said resistors R1°, R2° and connected to the control device M, on the one hand, and by another series connection, between the base supply voltage VSS and the positive supply voltage VDD, having a parallel circuit of the transistors T1, T1', T1" and a third resistor R3° connected in series thereto; in this case, a nodal point between the third resistor R3°, on the one hand, and the transistors T1, T1', T1", on the other, is connected to an input of the control unit M.

A channel resistance and the output current Idsat* at the output of such transistors or such a driver circuit T can be determined by balancing of this bridge circuit by varying the number of active transistors T1, T1', T1" by means of the control unit M, so that the output circuit with transistors similar thereto according to FIG. 19 or 20 can be adjusted accordingly. This is also possible during operation of the circuit. The at least one control signal m, generated by the control unit M, is applied at transistors of a driver circuit T. The control unit M can have, inter alia, an analog-to-digital converter and a sequential control, optionally also filters, particularly digital filters.

It is generally disadvantageous that high values of the output current Idsat * unavoidably lead to a low channel resistance and thereby lead to underdamping. As a result, oscillations of the RLC resonant circuits distort the voltage waveform at the load, so that data transmission can be disturbed.

In addition, voltage peaks arise in the internal chip supply voltage of an integrated circuit of this type, which reduce the lifetime of the circuits. Sufficient damping of the resonances is therefore to be sought.

Problems arise as a result for dimensioning of the final stage of a driver circuit. If due to a direct design or optionally an electronic activation of a suitable number of transistors, an effective final stage width/length ratio is selected, so that with a high chip temperature, low operating voltage VDD-VSS, and slow production technology, a required transmission rate is reliably achieved, a considerable overshoot at the load A and the chip internal operating voltage or supply voltage can be observed even starting at a data rate of 50 MHz, e.g., in the opposite situation, that is, a low chip temperature, high operating voltage, and rapid production technology. The situation of a high operating voltage, rapid production technology, and high chip temperature is more likely to be relevant for the lifetime, whereby this does not greatly change the problem. If dimensioning is undertaken for this case or for the rapid case, the speed in the slow case may no longer be sufficient and the data transmission becomes faulty.

The higher the sought data rate, the more likely that the goals of transmission reliability and lifetime cannot be achieved simultaneously by static sizing of the final stage width/length ratio by the direct layout or by connectable transistors according to FIG. 19 or 20.

Various methods were used to avoid this. Thus, it is prior in the art to influence a slew rate of the transistors with use of the so-called Miller effect, whereby the needed capacitors are very large however and a prestage of the driver circuit must be able to supply more current or otherwise the circuit becomes slower. A latency period increases, i.e., a time period between a change of an input signal of the driver circuit and a start of a response at the output thereof. An alternative consideration of the output signal with feedback to a control is also risky, because parasitic feedback can become established via the very disturbed operating voltage and the entire circuit can become unstable.

In a system according to FIG. 21, it is a disadvantage that the transistors T1, T1', T1", etc., must be replicas of the transistors that are to be controlled, therefore, i.e., in particular replicas of the final stage transistors of a driver circuit. Only then would the values measured at the transistors T1, T1', T1" agree sufficiently with the values occurring at the input/output drivers of the driver circuit T. Typical input/output transistors are large, whereby a value W=20 μm is not uncommon. Such values occur in assemblies of up to 16 and more transistors. Replicas of such assemblies are accordingly large. Therefore, large currents also flow through the third resistor R3. Aging or the area requirement of the third resistor R3 therefore also become a problem.

Ultimately the power requirement of such a circuit arrangement is high when all transistors T1, T1', T1", etc., are activated, whereby a few 100 mA can definitely result.

SUMMARY OF THE INVENTION

It is therefore an object of the invention to provide in a simple manner knowledge of parameters relevant for the circuit, whereby these are parameters that are independent of input data or input signals for regular switching of switching transistors of an integrated circuit.

Accordingly, a circuit arrangement is provided for controlling switching transistors of an integrated circuit with a bridge circuit and with a control unit, which is designed and/or has a program, whereby the control unit is designed as a measuring device and measures a bridge voltage of the bridge circuit, outputs an adjusting signal for adjusting a component of a bridge circuit, and outputs a control signal for activating the switching transistors. It is advantageous in this regard if the bridge circuit has a branch with a resistor network and a transistor, connected in series, and the control unit is designed and/or has a program so that the adjusting signal for adjusting a resistance value of the resistor network is switchable as the component dependent on the bridge voltage. This type of arrangement finally enables a determination of a channel resistance or a corresponding current by means of bridge balancing, so that similar transistors in effect can achieve more stably a target channel resistance or a corresponding target current of the driver circuit through the transistor.

The resistor network can be formed by a plurality of resistors and adjustment transistors for switching the resistors, the adjustment transistors being switchable by the adjusting signal. The control unit is preferably designed to monitor the bridge voltage and to balance it to zero, in that the adjusting signal is applied not at the transistor but at the resistor network.

In particular, the control unit can have a differential amplifier, an analog-to-digital converter, and a digital automaton. Alternatively, it is advantageous when the circuit arrangement is connected to a differential voltage for balancing the bridge circuit, whereby a comparator is connected between a differential amplifier and an input of a digital automaton and the digital automaton is designed or programmed as an integration unit. In the case of this arrangement, the automaton must just count only clocks in which the comparator assumes the value of 0 in downward counting or the value of 1 in upward counting.

In this case, a capacitor as the first and/or second capacitive component, filtering out interfering signals, can be connected between at least one input of the differential amplifier and the base supply voltage. Preferably, a first input of the differential amplifier is connected to a node between a first and a second resistor, connected together in series, of one branch of the bridge circuit and a second input of the differential amplifier is connected to a node between the transistor and the resistor network of the other branch, whereby an additional, particularly fourth resistor and an additional, particularly fourth capacitor are connected in series to one another so that the additional resistor is connected from a gate terminal of the transistor parallel to the resistor network to a positive supply voltage in particular and the additional capacitor is connected from the gate terminal of the transistor to the base supply voltage. Advantageously, the gate voltage of the transistor is filtered as a result, which is realizable particularly with a small gate current with an RC filter with a large resistor and relatively small capacitor, to enable saving of space.

The circuit arrangement can be formed as a crystal of a chip with the thereupon monolithically realized control unit, bridge circuit, and resistor network and directly thereupon switching transistors or thereupon a semiconductor component with the switching transistors, without there being problems during switching in such an arrangement. The circuit arrangement in particular has a positive supply voltage and a base supply voltage, to which both the control unit, bridge circuit with the resistor network, and the switching transistors or a semiconductor component with the switching transistors can be connected for their voltage and/or current supply. The switching transistors in this case can switch or activate a load, whereby the load is connected to a positive supply voltage and/or to a base supply voltage of a PCB carrying the circuit arrangement.

Further, a method for controlling switching transistors of an integrated circuit with a bridge circuit and with a control unit is provided, which is designed and/or has a program so that a bridge voltage of the bridge circuit is measured by the control unit, an adjusting signal for adjusting a component of a bridge circuit is output depending on the measured bridge voltage, and a control signal for activating the switching transistors is output. It is advantageous, when a bridge circuit that has a branch with a resistor network and a transistor, connected in series, is used as the bridge circuit, and by means of the control unit the adjusting signal for adjusting a resistance value of the resistor network is switched as the component dependent on the bridge voltage.

The resistor network can be formed by a plurality of resistors and adjustment transistors for switching the resistors, whereby the adjustment transistors are switched by the adjusting signal. Preferably, the bridge voltage of the bridge circuit is monitored and the effort is made to balance the bridge voltage to zero, by applying the adjusting signal suitably to the resistor network.

When the bridge circuit is balanced to a differential voltage of zero, whereby a comparator, particularly a 1-bit analog-to-digital converter, is connected between a differential amplifier and an input of a digital automaton and a digital automaton is designed or programmed as an integration unit, clocks can be counted in which the comparator assumes the value of 0 in downward counting or the value of 1 in upward counting, whereby higher-value counter bits are used first for adjusting the resistor network, which represents a so-called delta modulator. This results in a control loop with a digital integrator, which ensures that the bridge voltage oscillates around the average of 0. The control signal is preferably generated in a constant, particularly linear reference to the adjusting signal.

In an embodiment, the bridge circuit can be balanced to a differential voltage of zero, whereby a differential amplifier is connected to a sigma-delta converter, having a summator, an integrator, and a comparator and a flip-flop, and a digital automaton converts the bit stream of this converter to a parallel measured value representation and whereby a control of the bridge balance thereby occurs with a signal from the digital automaton and whereby the driver transistors to be controlled are activated by a signal from the digital automaton according to the bridge balance.

The circuit arrangement can have a digital automaton, which provides the adjusting signal for the adjustable resistor or the resistor network and the control signal for the external load, and which has a digital filter. This additional filter can in particular provide an integration and be provided as a sigma-delta converter.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 16 is a conventional printed circuit board with driver circuit for driving a load;

FIGS. 17 and 18 are voltage-time diagrams of the conventional circuit;

FIG. 19 is a circuit for the binary weighting of final stage transistors of this type of driver circuit according to the conventional art;

FIG. 20 is a circuit for the thermometer weighting of final stage transistors of a driver circuit of this type according to the conventional art; and FIG. 21 is a conventional measuring circuit for determining parameters for the switching of transistors of a lower-ranking circuit, particularly a driver circuit.

DETAILED DESCRIPTION

Figure 1:
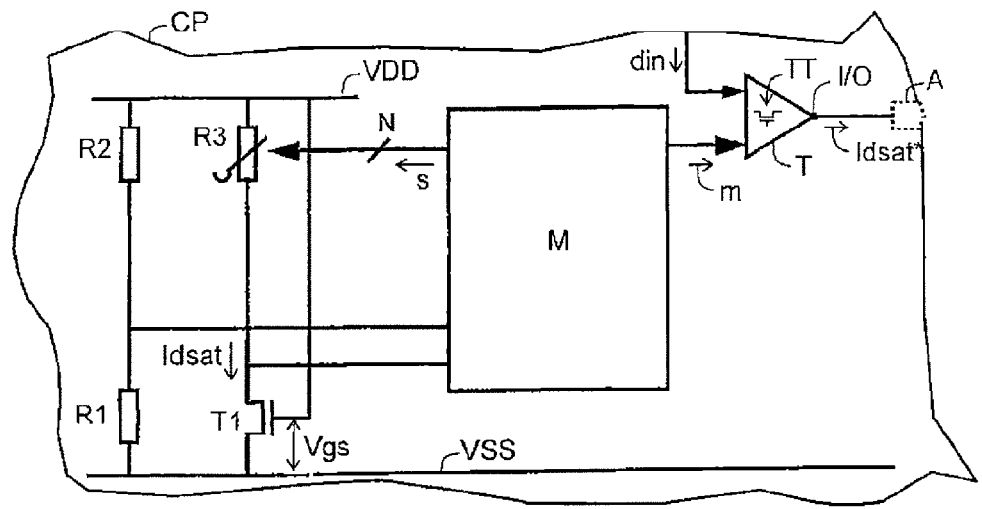
FIG. 1 schematically illustrates a circuit with a driver circuit for driving a capacitive load with a control unit connected as a measuring unit, according to an embodiment.

FIG. 1 shows a basic circuit diagram of an embodiment of a control unit M designed as a measuring device. A first and a second resistor R1, R2 are connected in series on a crystal of a chip CP in a monolithic realization between a base supply voltage and a positive supply voltage VDD, VSS. A nodal point between the first and second resistor R1, R2 is connected to the control unit M. In addition, a resistor network R3, shown as a third resistor, and a transistor T1 as a measuring transistor are connected in series between the supply voltages VSS, VDD. A contact point between the transistor T1 and the resistor network R3 is connected to the control unit M. The resistor network R3 is formed by a plurality of resistors, which can be connected in the connecting line between the node to transistor T1 and the positive supply voltage VDD via the control unit M. In other words, the first and second resistor R1, R2 and the resistor network R3 and the transistor T1 form a bridge, whereby the taps of the bridge are measured in a manner known per se.

For the example of an input/output stage of a driver circuit T or in general a switching application, regulation of an output signal, particularly an output current Idsat* at an input/output I/O of an actually to be controlled driver circuit T or a switch is to be avoided, because the regulation varies the current uptake of the circuit and this affects the arising interference voltages. These interference voltages in turn enter the output signal, so that undesirable and in principle unforeseeable feedback branches could arise. In addition, it is difficult in general to determine an overshoot of the output signal and the chip-internal supply voltage with the chip-internal operating voltage, extremely contaminated by switching pulses, as the supply voltage VSS, VDD.

Knowledge of a channel resistance and the output current Idsat* or the output signal and a control of the final stage derived therefrom or of transistors as switching transistors TT in the driver circuit T is sufficient for switching tasks. In this case, a very precise matching of the channel resistance and the output current Idsat* is not necessary. It can therefore be assumed also without a special adaptation layout that a measuring transistor, similar to the switching transistors TT, particularly a final stage transistor in the driver circuit T, in the form of the transistor T1 of the bridge circuit on the same chip has approximately the same properties as if it were a replica. The basic circuit diagram according to FIG. 1 takes these criteria into account.

Advantageously, the transistor T1 of the bridge circuit corresponds in technology, width, length, precise layout, and orientation to the switching transistors TT that one would like to control, so that it represents a replica. In principle, the bridge circuit is a case of the arrangement of the first and second resistors R1, R2, connected in series, and parallel thereto the arrangement, connected in series, of transistor T1 and the resistor network R3. The control unit M, designed as a measuring device, monitors the bridge voltage and attempts to balance it to zero, in that control signals are applied not at the replica transistors, however, but via a preferably digital control bus at the resistor network R3.

The resistor network R3 is activated by the control unit M by means of an adjusting signal, which is applied via a line bus by way of a vectorial quantity. A number N of the lines corresponds in this case preferably to a line with less than a number of switchable resistors in the resistor network R3.

With a circuit arrangement of this type, now one or more driver circuits T according to, for example, FIG. 19 or 20 can be influenced in that depending on the result the control unit M connects in addition a more or less effective width/length ratio of the transistor. Special secondary effects with a combination of such circuits and controls on the driver circuit are not considered further here for the sake of simplicity, because they hold no importance for the basic concept. As a result, despite variation of chip temperature, average operating or supply voltage, and manufacturing technology, a relatively close tolerance of the channel resistance and the output current Idsat* at the switching transistors TT of the driver circuit or driver circuits T can be achieved, so that the disadvantageous effects no longer occur appreciably. The entire measuring circuit in the form of control unit M can be small compared with an area required for the driver or the switching transistors TT in an integrated circuit, so that the cost of the preferred embodiment is relatively low.

Because only one transistor T1 is activated, in contrast to prior-art embodiments, the power consumption in the right bridge branch in particular also is lower by a factor 5 or more. As a result, the overall power consumption of the circuit arrangement can decline by approximately the same factor. Accordingly, less effort is to be expended in the resistor network R3 to avoid undue heating.

Figure 2:
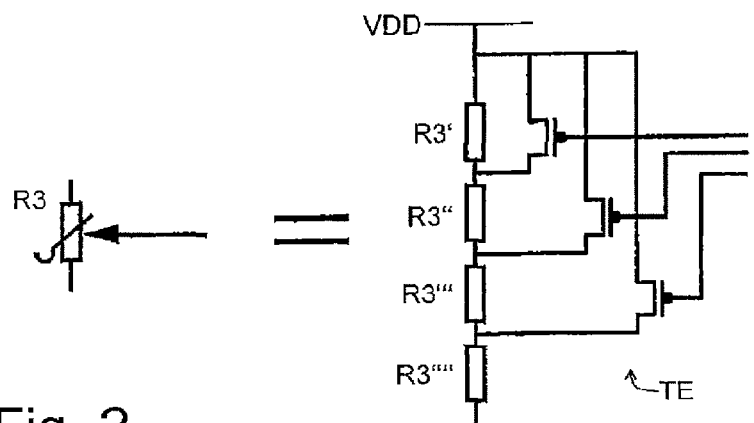
FIG. 2 is a circuit arrangement for controlling a resistance value in a bridge circuit of the circuit.

FIG. 2 shows a first exemplary circuit arrangement for controlling a resistance value of the resistor network R3 in the bridge circuit according to FIG. 1. The adjustability of the resistance value of the resistor network R3 is made possible by a series connection of a plurality of individual resistors R3', R3'', R3''', R3'''', in which a nodal point in each case can be connected between two of these resistors R3', R3'', R3''', R3'''' in each case by means of an adjustment transistor TE to the positive supply voltage VDD. In particular, to generate a desired resistance value, only one of the adjustment transistors TE is to be connected by the adjusting signal s.

Figure 3:
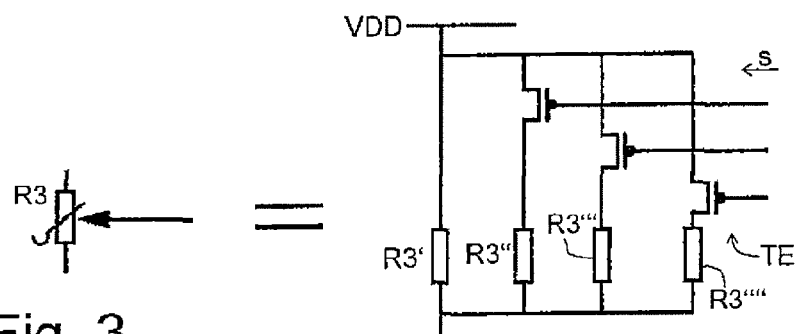
FIG. 3 is an alternative circuit arrangement for controlling the resistance value in the bridge circuit.

FIG. 3 shows an alternative circuit arrangement for controlling the resistance value in the bridge circuit in which the resistors R3'-R3'''' are connected parallel to one another between the transistor T1 and the positive supply voltage VDD. Except for preferably one of these resistors R3', in each case an adjustment transistor TE is connected in the line to each of the other resistors R3''-R3''''.

In the case of the series connection, the resistors R3'-R3'''' are preferably laid out similarly. In the case of a dissimilar layout or also in the case of parallel connection, a nonlinear relation of the resistance value and switch code is obtained, which can perhaps be useful when a resolution via the code is to be distributed differently. With a suitable selection of the resistance values, linear relations can be approximated by the parallel connection, which reduces the number of required adjustment transistors TE. For example, two resistor types can be used also per resistor R3'-R3'''', so that, e.g., the temperature coefficient can be compensated.

Figure 4:
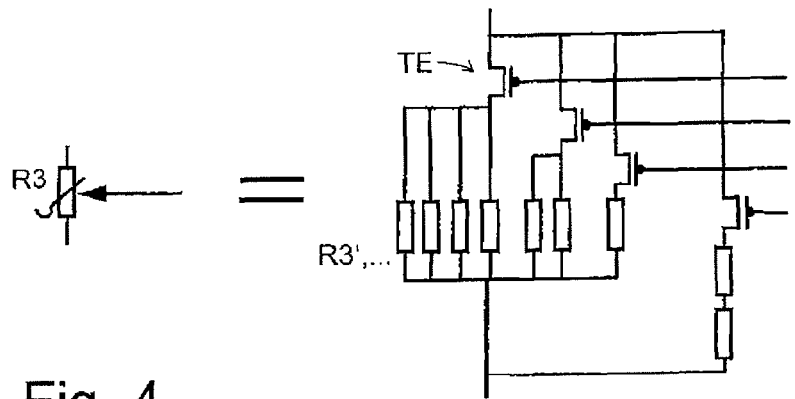
FIG. 4 is a circuit arrangement as a combination of the two preceding circuit arrangements.

It is also possible to combine a series connection with a parallel connection, as is shown by way of example with use of FIG. 4. This is helpful when because of the required resolution a large resistance range must be adjustable and the individual resistors are to be the same. The same resistance value of the individual resistors R3'-R3'''' occurs repeatedly in parallel up to singly and then twofold, fourfold, etc., in series.

Figure 5:
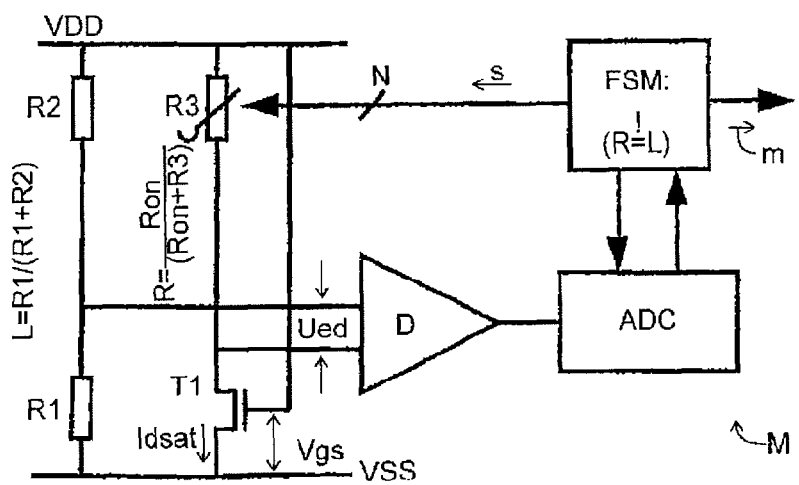
FIG. 5 is a circuit arrangement expanded in comparison with FIG. 1.

FIG. 5 shows a detailed embodiment of the basic circuit diagram according to FIG. 1. Instead of a schematically depicted control unit M, a differential amplifier D, an analogto-digital converter ADC, and a digital automaton FSM are shown as components. The two nodes of the bridge circuit, i.e., the node between the first two resistors R1, R2 or the node between the transistor T1 and the resistor network R3, are located at the inputs of the differential amplifier D. An output of the differential amplifier D is applied to the analog-to-digital converter ADC, which can exchange data bidirectionally with the digital automaton FSM. The digital automaton FSM provides the line or signal bus, which is applied therefrom at the resistor network R3. In addition, the control signal m for the driver circuit T, for example, is generated by the digital automaton FSM and output to it via a line.

In this arrangement, the differential amplifier D amplifies the bridge voltage. The digital automaton FSM controls a measuring process and an output and preparation of a representation of the sought parameters. The analog-to-digital converter ADC is started for this purpose by the digital automaton FSM. The digital automaton FSM influences the resistance value of the resistor network R3 according to the converter result so that the bridge is balanced. A channel resistance Ron or the current Idsat of the reference transistor, transistor T1, of the bridge circuit can be measured thereby, whereby the resistance value of the resistor network R3 forms the reference.

In this exemplary circuit, the differential amplifier D on the left side of the figure sees the positive operating or supply voltage VDD reduced by a factor of L=R1/(R1+R2). If the transistor T1 is operating resistively, therefore with channel resistance Ron, this being an approximation, because the channel resistance also depends on a gate voltage Vgs, an operating voltage reduced by a factor of R=Ron/(Ron+R3) results on the right side. A differential input voltage Ued thereby corresponds to a value of VDD*L-VDD*R. In case of balancing, only L=R needs to be fulfilled, namely, independent of the operating voltage VDD. So that the transistor T1 operates in the resistive range, its drain-source voltage must be low, e.g., constitute 400 mV. Therefore, with the given positive supply voltage VDD and with the balancing of the bridge, the factor L on the left side is established, whereby the range which is to cover the resistor network R3 follows from the transistor properties. The two first resistors R1 and R2 thus can be high-impedance, as the area required for this permits.

In other words, the balancing range and therefore operating range of transistor T1 in the balancing of the bridge are established by the second and first resistor R2, R1.

If the left bridge voltage is about 400 mV, then in the case of the balanced bridge the channel resistance Ron of the measuring transistor T1 is measured. The corresponding channel resistances of the transistors TT in FIG. 1 or the transistors in FIGS. 19 and 20 can be estimated from this.

If the measuring transistor T1 is to operate as the current source with a current value Idsat, this also being an approximation, because the channel current also depends on the gate voltage Vgs, its drain-source voltage in the bridge balancing should constitute about half of the operating voltage, so that the channel current is then approximately independent of the voltage across the channel. The following is obtained from the principles of electrical engineering for the current from the balance condition of the bridge that the value on the left side L and the right side R in FIG. 5 are to be the same, which is accordingly controlled by the digital automaton FSM: Idsat=VDD/R3*(1−L). The linear dependence of the measurement result for the current Idsat on the positive supply voltage VDD is not a problem but even beneficial, because at the same load A or its value according to FIG. 1 or 16, the current must scale with the positive supply voltage VDD or CVDD-CVSS, so that the recharging by a current source can always occur at the same time. The determination from the current value Idsat of the measuring transistor T1 again permits estimation of the corresponding currents of transistors TT in FIG. 1 or the transistors in FIGS. 19 and 20, with the limitation that the scaling proceeds—as stated—through the positive supply voltage VDD.

In each case, the measurement depends on the resistor network R3 as a reference element. This is a basic limitation of the accuracy, because the resistor network R3 in integrated circuits is definitely subjected to variations of 10% or more. The embodiment as an n-implanted resistor is advantageous, because in advanced production processes both the dose and the profile must be reproducible very accurately to be able to produce any transistors at all. Tolerances of only a few percentages are then possible. The resulting temperature coefficient of the resistor network R3 can be readily compensated, in that the digital automaton FSM includes a temperature value in the measurement. A possible so-called bandgap reference on many integrated circuits or even a special temperature measuring circuit according to the bandgap principle known per se allows this cost-effectively with only a 1K (Kelvin) standard deviation.

Particular attention is focused on effects by disturbed operating voltages. As described above, the operating voltage of the bridge is extremely contaminated with interfering pulses, as is also evident from FIGS. 17 and 18. This can cause errors in the determination of the channel resistance Ron and the current Idsat, when no countermeasures are taken.

Elimination of the effect of the operating voltage CVDD-CVSS on the measurement by means of the bridge circuit requires that a common mode rejection by the differential amplifier D is sufficiently great, namely, also at frequencies of, for example, up to 100 MHz, whereby the top frequency of the disturbances depends on the employed transistors and parasitic RLC elements. The elimination of the effect also requires that the channel resistance Ron and the current Idsat are independent of the operating voltage, which is not the case, however. The differential amplifier D and the analog-to-digital converter ADC in any event cannot be operated with this type of contaminated operating voltage, which is why quiescent operating voltages, which require a so-called mixed-signal IC for other analog functions in any event in a higher-order circuit arrangement, are used for such components as analog components.

Figure 6:
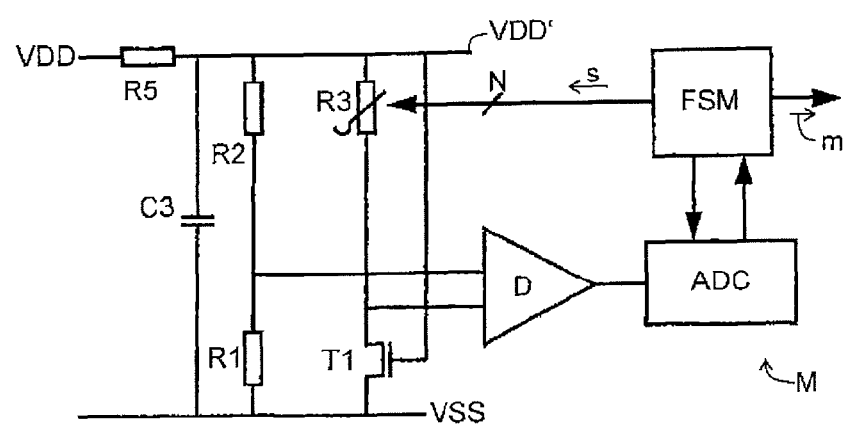
FIG. 6 is a circuit arrangement expanded by a resistor-capacitor filter.

If applicable, the operating voltage VDD'-VSS of the measuring circuit, i.e., the bridge with transistor T1, can be drawn not directly from the drivers or driver stages T, but a prefiltering of the operating voltage by means of a circuit arrangement is performed beforehand according to, for example, FIG. 6 to reduce the disturbances. The bridge in this regard is not applied directly to the positive supply voltage VDD, but to another positive supply voltage VDD', which via a fifth resistor R5 is present at the positive supply voltage VDD. In addition, a capacitor as a third capacitive component C3 is connected between this additional positive supply voltage VDD' and the base supply voltage VSS parallel to the bridge circuit.

Utilized in this case is the fact that the sought quantities are variable at a slow rate, because the average operating voltage changes only with a change in load depending on the blocking capacitance in the ms range. The chip temperature more likely will vary even more slowly. Therefore, another positive supply voltage VDD' comes from the positive supply voltage VDD. Because transistor T1 used as the network transistor draws considerable currents, limits are set for the fifth resistor R5, however; in this case, an unmanageably large capacitor is required as the third capacitive component C3. This solution is therefore realizable but is rather uneconomic.

It is therefore more advantageous to use a low-pass behavior of the differential amplifier and optionally to expand by means of, e.g., a Miller capacitor. In addition, accordingly additional capacitors can be connected as the first and second capacitive component C1 or C2 according to FIG. 7 to the input of the differential amplifier D, which also dampen the common mode portion. For this purpose, the first of the capacitive components C1 is connected between the base supply voltage VSS, on the one hand, and the first of the inputs of the differential amplifier D, on the other, which is located at the node between the first and the second resistor R1, R2. The second capacitive component C2 is connected to the second input of the differential amplifier D, which leads to the node between transistor T1 and the resistor network R3.

Transistor T1 receives its gate control through the operating voltage, because its channel resistance Ron and its current according to the current Idsat corresponds only then to that of driver stage T. As a result, however, interference pulses in addition modulate the transistor properties and thereby the bridge voltage. Advantageously, therefore, the gate voltage of transistor T1 is filtered, which is possible with a small gate current with an RC filter with a large resistor and relatively small capacitor, to enable saving of space, and is drawn in FIG. 8. Proceeding from FIG. 7, in this case, a fourth resistor R4 is connected in the connection between the gate terminal of transistor T1 and the positive supply voltage VDD. In addition, the fourth capacitor C4 is connected between the gate terminal of transistor T1 and the base supply voltage VSS.

The interference voltage issue is illustrated by way of example with use of the following figures. Shown in the figures is a signal form at a left bridge node li, at a right bridge node re, the differential voltage dif of the differential amplifier D, and optionally the supply voltages VDD, VSS.

A balanced bridge without interference voltages would show the bridge voltages without a disturbance in the positive supply voltage VDD as a flat curve of the voltage over time.

Figure 9:
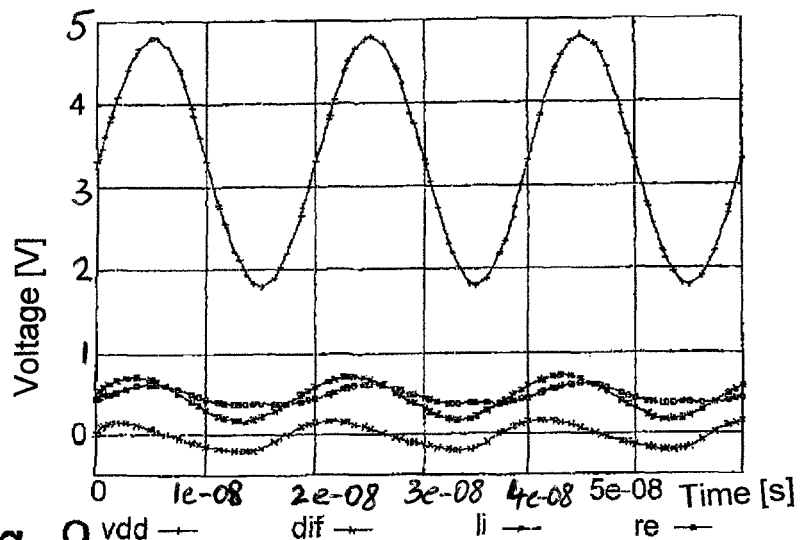
FIG. 9 is a voltage-time diagram for illustrating a bridge voltage for a channel resistance with a disturbance of the positive supply voltage.

FIG. 9 shows the relationships with a sinusoidal interference voltage during the measurement of the channel resistance. The two bridge branches are typically not the same in regard to their parasitic capacitors. Therefore, the effort is made to design the left branch as high-impedance because of the power consumption, particularly much more high-impedance than the right branch, which is established by the transistor properties. Transistor T1 behaves only approximately as an ohmic resistor and in addition varies its gate voltage Vgs. This results in amplitude and phase differences in the branch voltages. As a result, the differential voltage dif is superposed with an alternating voltage disturbance, but also with a rather small direct current shift. This results primarily from the quadratic modulation of the transistor characteristics with the gate voltage. Nevertheless, the disturbance at low frequencies is even lower, however, than when the left branch of the bridge would be entirely omitted and only the right branch would be used. In such a case, which is called single-ended, a "balancing" and the ensuing simplifications of the analog circuits in this case would also be only partly or no longer possible.

Figure 7:
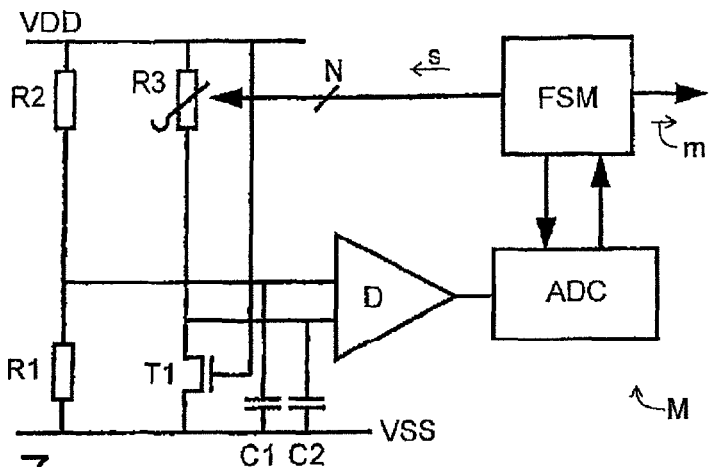
FIG. 7 is a circuit modified in comparison.
Figure 8:
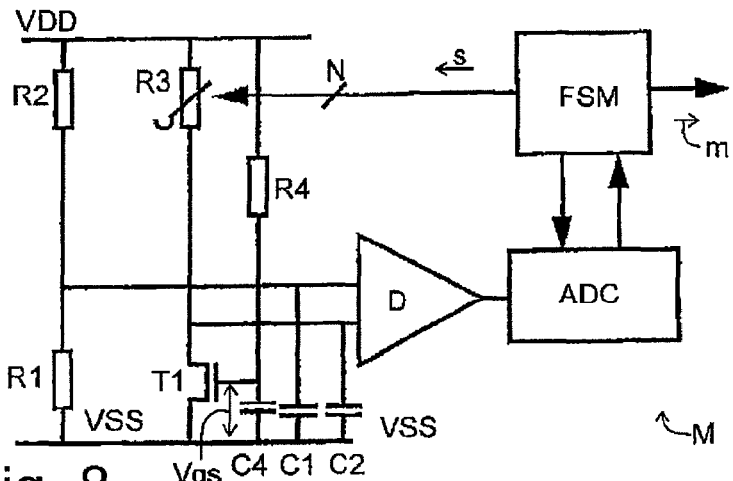
FIG. 8 is a circuit further modified in comparison.
Figure 10:
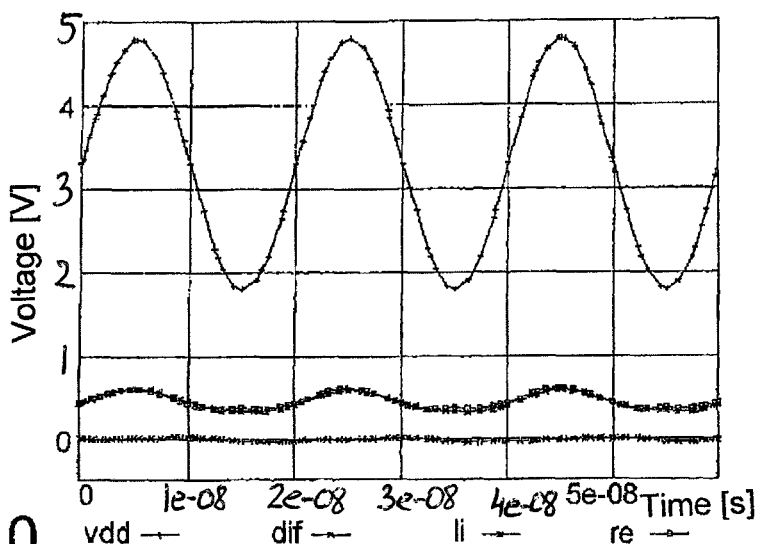
FIG. 10 is a voltage-time diagram of this type for a channel resistance with use of a filter.

FIG. 10 again shows the case of disturbance for the measurement of the channel resistance, but now two capacitors are connected as the first and the second capacitor C1, C2, according to FIG. 7, to the inputs of the differential amplifier D. If the differential amplifier D is not to be acted upon, with view to the Miller effect, this is a rather effective solution, when the left branch with the ohmic resistors R1, R2 is high-impedance, because a low cut-off frequency for the differential disturbance also results even with a moderate capacitance. The direct voltage shift of the average of the bridge voltage can be seen better by the dampened alternating voltage. It is explained by the nonlinearity of transistor T1 and the modulation of its gate voltage Vgs. To shut this down, as according to FIG. 8, the gate voltage Vgs as well of transistor T1 would have to be filtered with the fourth resistor R4 and the fourth capacitive component C4.

Figure 11:
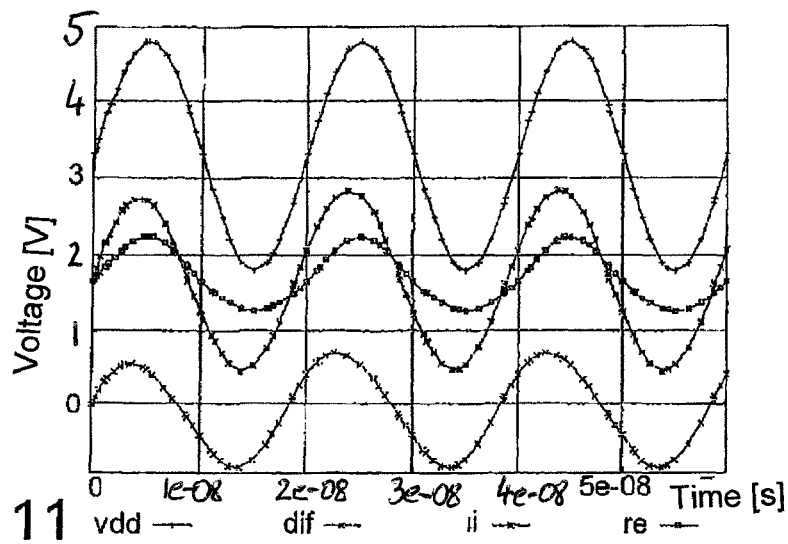
FIG. 11 is a voltage-time diagram for illustrating a bridge voltage for a current at a driver circuit output with a disturbance of the positive supply voltage.
Figure 12:
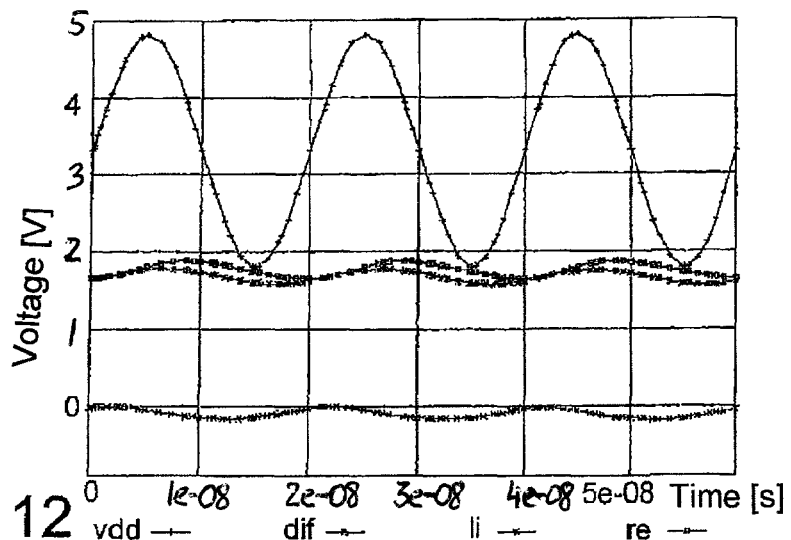
FIG. 12 is a voltage-time diagram of this type with use of a plurality of capacitive components.
Figure 13:
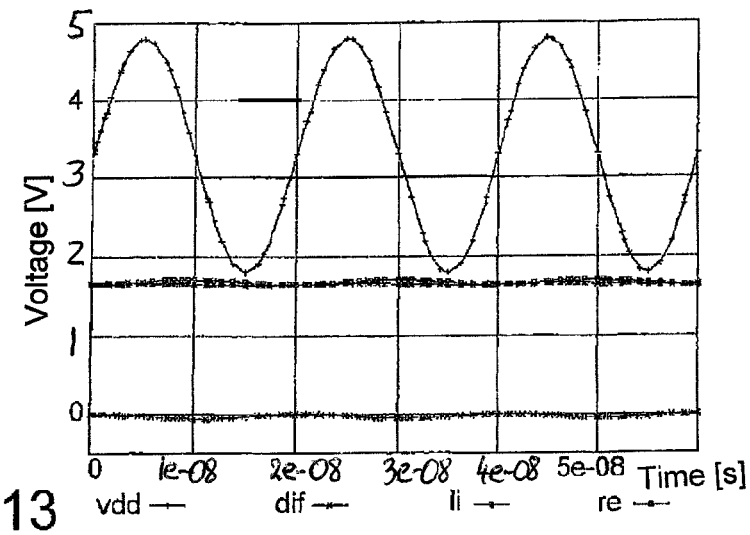
FIG. 13 is a voltage-time diagram with use of a different arrangement of capacitive components.

The relationships for the measurement of the current according to the current Idsat is shown using FIGS. 11 to 13. Disturbances in the differential voltage are even worse in this case and require even greater care during filtering.

The analog-to-digital converter ADC because of the contamination of the operating voltage and thereby the bridge voltage as well may not react sensitively to interfering signals. For this reason, for example, direct use of an analog-to-digital converter according to the so-called method of successive approximation is not suitable. Suitable, in contrast, are analog integrating methods or methods in which a digital counter or possibly a digital filter performs the integration in the digital automaton FSM, whereby in particular a sigma-delta converter can be used. In the latter case, the requirements for interference elimination for the bridge voltage are the lowest, because the disturbances by the converter method averaged out better. A circuit suitable for this is shown in FIG. 14.

Figure 14:
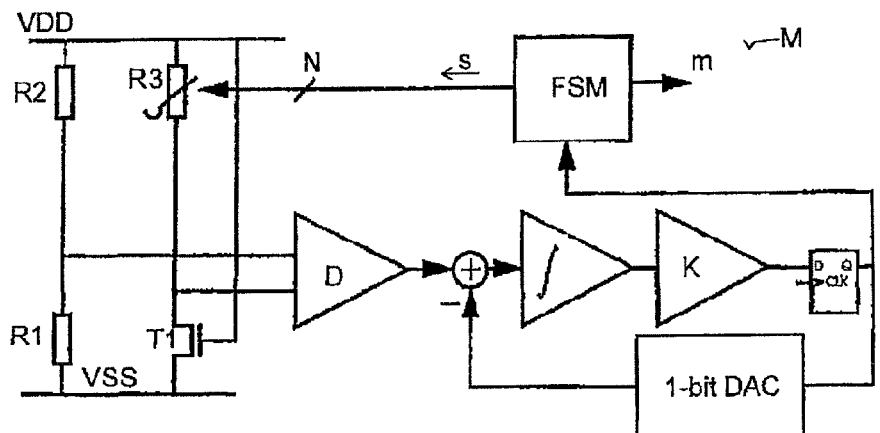
FIG. 14 is a circuit arrangement, modified in comparison with FIG. 1, with a first-order 1-bit sigma-delta analog-to-digital converter.

For converting of a first-order sigma-delta converter according to FIG. 14, the first-order, 1-bit sigma-delta converter is connected between the output of the differential amplifier D and the assigned thereto input of the digital automaton FSM. The converter is formed substantially of a subtractor, whose first input is located at the output of the differential amplifier D. An output of the subtractor is located at an integrator, whose output is applied at comparator K. An output of the comparator K is located at a flip-flop, whose output, on the one hand, is located at the input of the digital automaton FSM and, on the other, is located at an input of a 1-bit digital-to-analog converter. Its output in turn is applied at the subtraction input of the subtractor. It is noticeable that the differential signal in the converter enters the integrator first via the subtractor; the frequency response of the subtractor $G(s)=1/s$ has a favorable effect on the interference issue. As in the other figures as well, this circuit arrangement is only schematic, which is already evident in the omission of the depiction of the clocking of the flip-flop. Nonetheless, analog prefilter measures are used preferably, as they are proposed in the circuit arrangements according to FIGS. 6 to 8. Those according to FIG. 8 in particular with elimination of disturbances in the gate voltage are advantageous, to deal effectively with direct voltage errors in the bridge by the quadratic dependence of the channel resistance and the current Idsat on the gate voltage in view of a demodulation of the disturbance in a nonlinear characteristic.

Figure 15:
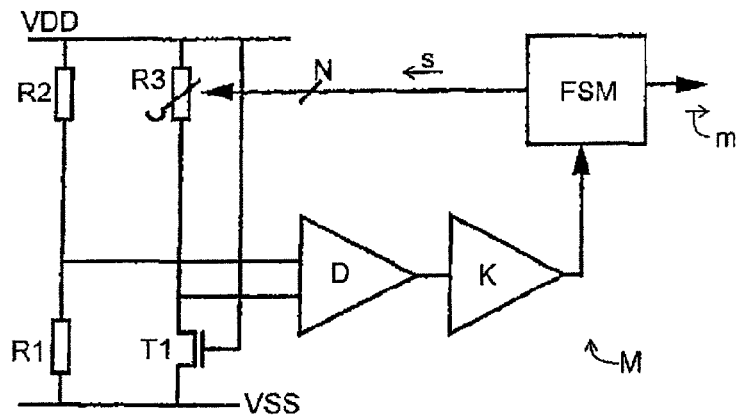
FIG. 15 is a circuit illustration, simplified in comparison, with a delta modulator.

The balancing of the bridge to a differential voltage with the value 0 permits a simplification, in that instead of the analog-to-digital converter ADC only a comparator, therefore a 1-bit analog-to-digital converter, is still used, as is shown in FIG. 15. According to the simplified diagram, the comparator is connected directly between the output of the differential amplifier D and the input of the digital automaton FSM.

The digital automaton FSM performs the integration, in that the digital automaton FSM counts the clocks in which the comparator assumes the value of 0 in downward counting or the value of 1 in upward counting. First, the higher-value counter bits are used for adjusting the resistor network R3. A control loop with a digital integrator results thereby, which ensures that the bridge voltage oscillates around the average of 0. The quality of the measurement can be improved further and the oscillation of the output values reduced by suitable digital processing, particularly filtering, of the switching stage values of the resistor network R3 in the digital automaton FSM.

In comparison to FIG. 14, the position of comparator K and integrator, here converted digitally in the digital automaton FSM, are exchanged, as a result of which the interference suppression for the control loop, comprising a bridge, differential amplifier D, comparator K, and digital automaton FSM, in FIG. 15 is lower.

FIG. 15 can also be regarded such that the sigma-delta converter would be made purely digitally and the input for this is stored by an analog-to-digital converter with only 1 bit resolution, i.e., by means of the comparator K. However, the adjustment rate of the resistor network R3 and the processing rate of the differential amplifier D of such a function are obstructive, because the resistor network R3 varies with a lower frequency than the comparator K can supply pulses; as a result, the noise forms of the implicit sigma-delta converter can function only partly or not at all.

It follows from this observation that the circuit arrangement according to FIG. 15 can represent a delta modulator for the mentioned control loop, when the digital automaton FSM contains a digital integrator for the bit stream from the comparator K. A control output is then a digital deep-pass-filtered representation of the control bit for the resistor network R3. In other words, the disturbances in the control loop can be filtered out and are not relevant to the control signal. This is met, however, only when the digital automaton FSM and the comparator K operate sufficiently rapidly, so that aliasing errors do not occur, which can no longer be filtered out when they enter the useful band.

Because digital gate functions in integrated circuits are becoming comparatively more and more economic, more complicated digital regulation and filtering algorithms can be used in the digital automaton. The digital automaton FSM can therefore be regarded as a pure hardware circuit, but also as a software-controlled processor or a combination of the two.

The components can be formed particularly using complementary metal-oxide semiconductor technology. This type of measurement and control, however, can also be used in all integrated circuits. With respect to the technology, there are virtually no limitations, even if in the present case a CMOS circuit was implied.

Any switching application, in which the principles of analog regulation or current mirrors, etc., cannot be used, can profit from the concept described above, in that overvoltages are reduced, optionally the lifetime of transistors, particularly switching transistors, is increased, a switching rate with the secondary condition of low RLC oscillations is optimized, the EMC emission behavior is improved by moderate current waveforms, and the output signal more likely increases or decreases monotonously instead of oscillating wildly. Typical applications can be in particular so-called off-chip bus drivers or also individual line drivers.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit arrangement configured to control switching transistors of an integrated circuit, the circuit arrangement comprising:
   a bridge circuit having a branch with a resistor network and a transistor connected in series, the transistor having a source, a gate and a drain, the gate of the transistor being connectable to a supply voltage; and
   a control unit for measuring a bridge voltage of the bridge circuit, and outputting both an adjusting signal for adjusting a resistance value of the resistor network and a control signal for controlling the switching transistors,
   wherein the adjusting signal provides that said resistance value is switchable among one of a plurality of values as a function of the bridge voltage.

2. The circuit arrangement according to claim 1, wherein the resistor network is formed by a plurality of resistors and adjustment transistors for switching the resistors, wherein the adjustment transistors are switchable by the adjusting signal.

3. The circuit arrangement according to claim 1, wherein the control unit monitors and balances to zero the bridge voltage, and wherein the adjusting signal is applied at the resistor network and not at the transistor.

4. The circuit arrangement according to claim 1, wherein the control unit has a differential amplifier, an analog-to-digital converter, and a digital automaton.

5. The circuit arrangement according to claim 1, wherein the bridge circuit is connectable to a differential voltage for balancing the bridge circuit, wherein a comparator is connectable between a differential amplifier and an input of a digital automaton-configured an integration unit.

6. A circuit arrangement configured to control switching transistors of an integrated circuit, the circuit arrangement comprising:
   a bridge circuit having a branch with a resistor network and a transistor connected in series; and
   a control unit for measuring a bridge voltage of the bridge circuit, and outputting both an adjusting signal for adjusting a resistance value of the resistor network and a control signal for controlling the switching transistors,
   wherein the adjusting signal provides that said resistance value is switchable among one of a plurality of values as a function of the bridge voltage,
   wherein the control unit monitors and balances to zero the bridge voltage,
   wherein the adjusting signal is applied at the resistor network and not at the transistor,
   wherein a capacitor as a first and/or second capacitive component is connectable between at least one input of the differential amplifier and a base supply voltage, and
   wherein an additional resistor and an additional capacitor are connected in series to one another so that the additional resistor is connected to a gate terminal of the transistor parallel to the resistor network and the additional capacitor to a gate terminal of the transistor to the base supply voltage.

7. The circuit arrangement according to claim 3, wherein a first input of the differential amplifier is connectable to a node between a first and a second resistor, which are connected in series to one another, of one branch of the bridge circuit and wherein a second input of the differential amplifier is connectable to a node between the transistor and the resistor network of the other branch of the bridge circuit.

8. The circuit arrangement according to claim 1, wherein the circuit arrangement is formed on a chip with said control unit, said bridge circuit, said resistor network and said switching transistors or a semiconductor component including said switching transistors realized on said chip.

9. The circuit arrangement according to claim 1, wherein the circuit arrangement has a positive supply voltage and a base supply voltage, to which both the control unit, bridge circuit with the resistor network, and switching transistors or a semiconductor component with the switching transistors are connectable to a voltage and/or current supply.

10. The circuit arrangement according to claim 9, wherein the switching transistors switch or activate a load, wherein the load is connectable to a positive supply voltage and/or to a base supply voltage of a printed circuit board.

11. A method for controlling switching transistors of an integrated circuit with a bridge circuit and with a control unit, the method comprising:
    measuring a bridge voltage of the bridge circuit;
    outputting an adjusting signal that adjusts a component of a bridge circuit based on the measured bridge voltage;
    outputting a control signal that is configured to control the switching transistors;
    wherein the bridge circuit has a branch with a resistor network and a transistor connected in series, the transistor having a source, a gate and a drain, the gate of the transistor being connectable to a supply voltage; and
    wherein, via the control unit, the adjusting signal for adjusting the resistance value of the resistor network, provides for switching the component so that one of a plurality of component values is selected based on the bridge voltage.

12. The method according to claim 11, wherein the resistor network is formed by a plurality of resistors and adjustment transistors for switching the resistors, the adjustment transistors being switched by the adjusting signal.

13. The method according to claim 11, wherein the bridge voltage of the bridge circuit is monitored and wherein the bridge voltage is balanced to zero by applying the adjusting signal to the resistor network.

14. A method for controlling switching transistors of an integrated circuit with a bridge circuit and with a control unit, the method comprising:
    measuring a bridge voltage of the bridge circuit;
    outputting an adjusting signal that adjusts a component of a bridge circuit based on the measured bridge voltage;
    outputting a control signal that is configured to control the switching transistors;
    wherein the bridge circuit has a branch with a resistor network and a transistor connected in series; and
    wherein, via the control unit, the adjusting signal for adjusting the resistance value of the resistor network, provides for switching the component so that one of a plurality of component values is selected based on the bridge voltage,
    wherein the bridge circuit is balanced to a differential voltage of zero, wherein a comparator is connected between a differential amplifier and an input of a digital automaton designed as an integration unit,
        wherein clocks are counted in which the comparator assumes a value of 0 in downward counting or a value of 1 in upward counting, and
        wherein higher-value counter bits are used first for adjusting the resistor network so that a delta modulator is represented.

15. The method according to claim 11, wherein the bridge circuit is balanced to a differential voltage of zero, wherein a differential amplifier is connected to a sigma-delta converter comprising a subtractor, an integrator, a comparator and a flip-flop, wherein a digital automaton converts the bit stream of this converter to a parallel measured value representation such that a control of the bridge balancing occurs with a signal from the digital automaton, and wherein the driver transistors that are to be controlled are activated by a signal from the digital automaton according to the bridge balance.

16. The method according to claim 11, wherein the control signal is generated in a linear relationship to the adjusting signal.

17. The circuit arrangement according to claim 1, wherein the gate of the transistor is directly connected to the supply voltage.

* * * * *